United States Patent
Song et al.

(10) Patent No.: US 9,496,181 B2
(45) Date of Patent: Nov. 15, 2016

(54) SUB-FIN DEVICE ISOLATION

(71) Applicant: QUALCOMM Incorporated, San Diego, CA (US)

(72) Inventors: Stanley Seungchul Song, San Diego, CA (US); Jeffrey Junhao Xu, San Diego, CA (US); Vladimir Machkaoutsan, Leuven (BE); Mustafa Badaroglu, Leuven (BE); Choh Fei Yeap, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/581,244

(22) Filed: Dec. 23, 2014

(65) Prior Publication Data

US 2016/0181161 A1    Jun. 23, 2016

(51) Int. Cl.
*H01L 21/8234* (2006.01)
*H01L 27/088* (2006.01)
*H01L 29/06* (2006.01)
*H01L 29/10* (2006.01)
*H01L 29/66* (2006.01)
*H01L 29/78* (2006.01)

(52) U.S. Cl.
CPC ............ *H01L 21/823481* (2013.01); *H01L 21/823412* (2013.01); *H01L 21/823431* (2013.01); *H01L 27/0886* (2013.01); *H01L 29/0653* (2013.01); *H01L 29/1041* (2013.01); *H01L 29/66803* (2013.01); *H01L 29/7851* (2013.01)

(58) Field of Classification Search
CPC ............ H01L 21/823481; H01L 21/823412; H01L 21/823431; H01L 27/0886; H01L 29/0653; H01L 29/1041

USPC ......................................................... 257/345
See application file for complete search history.

(56) References Cited

U.S. PATENT DOCUMENTS

| | | | |
|---|---|---|---|
| 7,041,553 B2 | 5/2006 | Kangguo et al. | |
| 8,735,990 B2 | 5/2014 | Anderson et al. | |
| 8,809,173 B1 | 8/2014 | Yin et al. | |
| 2008/0135888 A1 | 6/2008 | Lee et al. | |
| 2011/0169101 A1* | 7/2011 | Doornbos | H01L 29/66795 257/394 |
| 2013/0280883 A1 | 10/2013 | Faul et al. | |
| 2014/0117462 A1 | 5/2014 | Cheng et al. | |

(Continued)

FOREIGN PATENT DOCUMENTS

| WO | 2014035556 A1 | 3/2014 |
|---|---|---|
| WO | 2015047253 A1 | 4/2015 |
| WO | 2015054916 A1 | 4/2015 |

OTHER PUBLICATIONS

International Search Report and Written Opinion—PCT/US2015/063619—ISA/EPO—Mar. 3, 2016.

*Primary Examiner* — Peter Bradford
(74) *Attorney, Agent, or Firm* — Seyfarth Shaw LLP

(57) ABSTRACT

A fin-based structure may include fins on a surface of a semiconductor substrate. Each of the fins may include a doped portion proximate to the surface of the semiconductor substrate. The fin-based structure may also include an isolation layer disposed between the fins and on the surface of the semiconductor substrate. The fin-based structure may also include a recessed isolation liner on sidewalls of the doped portion of the fins. An unlined doped portion of the fins may extend from the recessed isolation liner to an active portion of the fins at a surface of the isolation layer. The isolation layer is disposed on the unlined doped portion of the fins.

12 Claims, 15 Drawing Sheets

(56) References Cited

U.S. PATENT DOCUMENTS

| | | | |
|---|---|---|---|
| 2015/0200252 A1* | 7/2015 | Ching | H01L 21/76224 257/510 |
| 2015/0372144 A1 | 12/2015 | Fang et al. | |
| 2016/0133696 A1* | 5/2016 | Yin | H01L 29/66803 257/402 |

* cited by examiner

SUB-FIN DEVICE ISOLATION

BACKGROUND

1. Field

Aspects of the present disclosure relate to semiconductor devices, and more particularly to isolation between adjacent devices.

2. Background

As integrated circuit (IC) technology advances, device geometries are reduced. Reducing the geometry and "pitch" (spacing) between devices may cause devices to interfere with each other in terms of proper operation.

Fin-based devices are three-dimensional structures on the surface of a semiconductor substrate. A fin-based transistor, which may be fin-based metal-oxide-semiconductor field-effect transistor (MOSFET) may be referred to as a FinFET. Doping a portion of a FinFET that is closer to the substrate for isolation between devices is difficult because the active portion of the fin either impedes implantation, or also receives implantation, thereby reducing the effectiveness of the attempted isolation.

SUMMARY

A method for isolating within a fin-based structure on a substrate may include providing a doped isolation liner on fins of the fin-based structure. The method may also include depositing a first layer of isolation material between the fins on sidewalls of the doped isolation liner. The method may further exposing a portion of the doped isolation liner on the fins. The method may also include exposing an active portion of the fins. The method may further include driving a dopant in the doped isolation liner into a doped portion of the fins including an unlined doped portion. The method may also include depositing a second layer of isolation material on the unlined doped portion of the fins and the first layer of isolation material to a boundary between the active portion and the doped portion of the fins.

A fin-based structure may include fins on a surface of a semiconductor substrate. Each of the fins may include a doped portion proximate to the surface of the semiconductor substrate. The fin-based structure may also include an isolation layer disposed between the fins and on the surface of the semiconductor substrate. The fin-based structure may also include a recessed isolation liner on sidewalls of the doped portion of the fins. An unlined doped portion of the fins may extend from the recessed isolation liner to an active portion of the fins at a surface of the isolation layer. The isolation layer is disposed on the unlined doped portion of the fins.

A fin-based structure may include fins on a surface of a semiconductor substrate. Each of the fins may include a doped portion proximate to the surface of the semiconductor substrate. The fin-based structure may also include a means for isolating disposed between the fins and on the surface of the semiconductor substrate. The fin-based structure may also include a recessed isolation liner on sidewalls of the doped portion of the fins. An unlined doped portion of the fins may extend from the recessed isolation liner to an active portion of the fins at a surface of the isolating means. The isolating means is disposed on the unlined doped portion of the fins.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of an aspect of the present disclosure, reference is now made to the following description taken in conjunction with the accompanying drawings.

DETAILED DESCRIPTION

Figure 1:
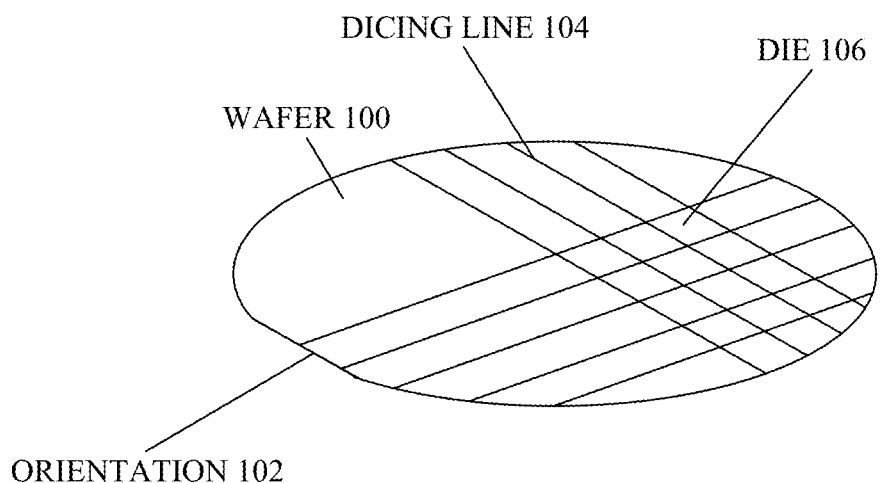
FIG. 1 illustrates a perspective view of a semiconductor wafer in an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Semiconductor device operation often involves isolating one device from another. In a planar or fin-based (three-dimensional) structure, adjacent devices, such as transistors, may be isolated either physically or electrically. A fin-based device is a three-dimensional structures on the surface of a semiconductor substrate. A fin-based transistor, which may be fin-based metal-oxide-semiconductor field-effect transistor (MOSFET), may be referred to as a FinFET.

As device geometries are reduced, and additional device structures are added to an integrated circuit, isolation of devices, particularly adjacent devices, becomes more difficult. In planar devices, implantation processes may be used to electrically isolate one device from another. In fin-based devices, however, the geometry of the fins, and the fin pitch, render standard implantation processes ineffective. In particular, doping the portion of a FinFET that is closer to the substrate for isolation between devices is difficult because the active portion of the fin either impedes implantation, or also receives implantation, thereby reducing the effectiveness of the attempted isolation.

Doping a portion of the fin closer to the substrate (e.g., the "base" portion") isolates the source and drain of the FinFET from the substrate and from other devices, allowing more precise operation and anti-punchthrough protection of each device. An aspect of the present disclosure describes doping a base portion of the fin, (e.g., that portion of the fin that is closer to the substrate) with a doped oxide. The doped oxide is patterned to control the portion of the fin receiving the doping. The doped oxide is annealed which drives dopant atoms into that portion of the fin. This aspect of the present disclosure incorporates an anti-punchthrough doping in a precise manner to the base portion of the fin-based structures, which helps suppress sub-fin leakage into the substrate and/or other devices.

Semiconductor fabrication processes are often divided into three parts: a front end of line (FEOL), a middle of line (MOL) and a back end of line (BEOL). Front end of line processes include wafer preparation, isolation, well formation, gate patterning, spacers, and dopant implantation. A middle of line process includes gate and terminal contact formation. The gate and terminal contact formation of the middle of line process, however, is an increasingly challenging part of the fabrication flow, particularly for lithography patterning. Back end of line processes include forming interconnects and dielectric layers for coupling to the FEOL devices. These interconnects may be fabricated with a dual damascene process using plasma-enhanced chemical vapor deposition (PECVD) deposited inter-layer dielectric (ILD) materials.

FIG. 1 illustrates a perspective view of a semiconductor wafer in an aspect of the present disclosure. A wafer 100 may be a semiconductor wafer, or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystalizes onto the seed crystal in the orientation of the crystal.

The wafer 100 may be a compound material, such as gallium arsenide (GaAs) or gallium nitride (GaN), a ternary material such as indium gallium arsenide (InGaAs), quaternary materials, or any material that can be a substrate material for other semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants, and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100.

The Miller Indices form a notation system of the crystallographic planes in crystal lattices. The lattice planes may be indicated by three integers h, k, and l, which are the Miller indices for a plane (hkl) in the crystal. Each index denotes a plane orthogonal to a direction (h, k, l) in the basis of the reciprocal lattice vectors. The integers are usually written in lowest terms (e.g., their greatest common divisor should be 1). Miller index 100 represents a plane orthogonal to direction h; index 010 represents a plane orthogonal to direction k, and index 001 represents a plane orthogonal to l. For some crystals, negative numbers are used (written as a bar over the index number) and for some crystals, such as gallium nitride, more than three numbers may be employed to adequately describe the different crystallographic planes.

Once the wafer 100 has been processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

Figure 2:
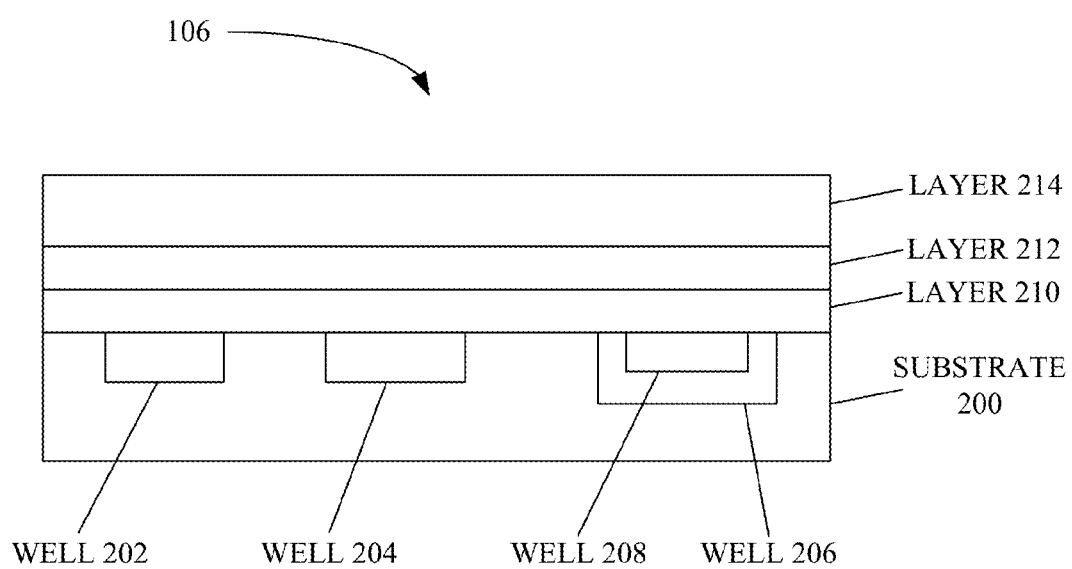
FIG. 2 illustrates a cross-sectional view of a die in accordance with an aspect of the present disclosure.

FIG. 2 illustrates a cross-sectional view of a die 106 in accordance with an aspect of the present disclosure. In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200.

Within a substrate 200 (e.g., a semiconductor substrate), there may be wells 202 and 204, which may be the source and/or drain of a field-effect transistor (FET), or wells 202 and/or 204 may be fin structures of a fin structured FET (FinFET). Wells 202 and/or 204 may also be other devices (e.g., a resistor, a capacitor, a diode, or other electronic devices) depending on the structure and other characteristics of the wells 202 and/or 204 and the surrounding structure of the substrate 200.

The semiconductor substrate may also have a well 206 and a well 208. The well 208 may be completely within the well 206, and, in some cases, may form a bipolar junction transistor (BJT). The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure.

Figure 3:
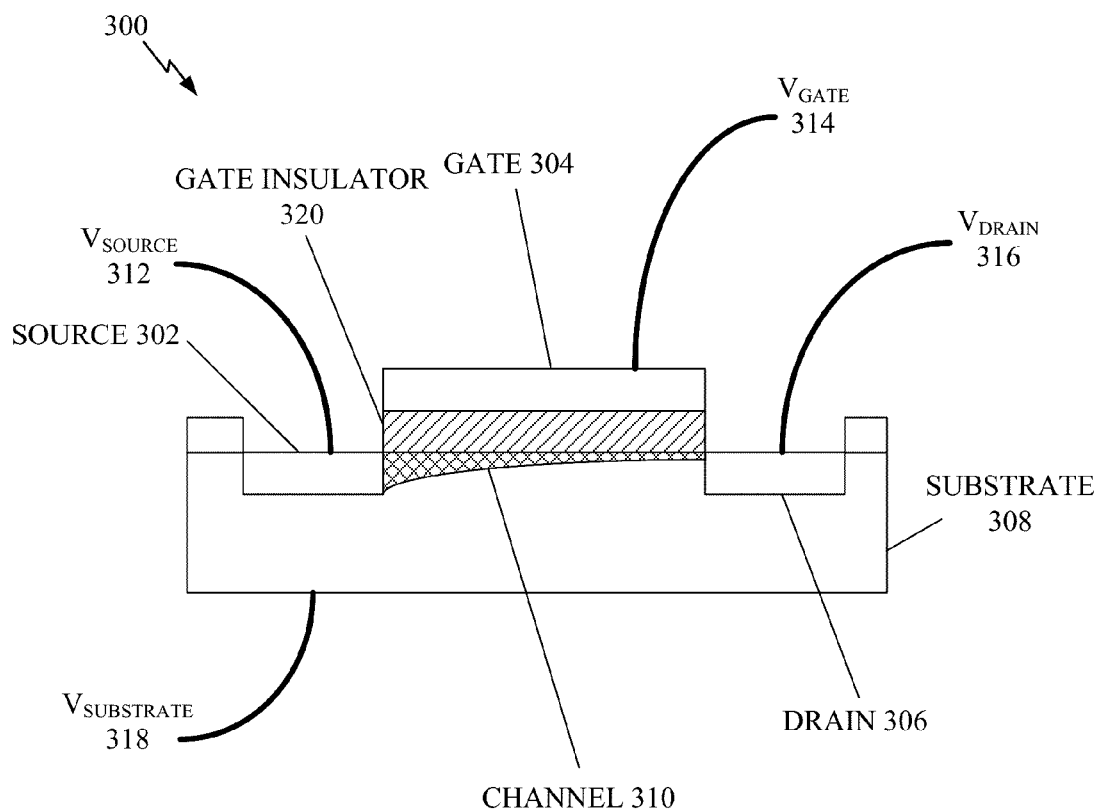
FIG. 3 illustrates a cross-sectional view of a metal-oxide-semiconductor field-effect transistor (MOSFET) device in an aspect of the present disclosure.
Figure 3:
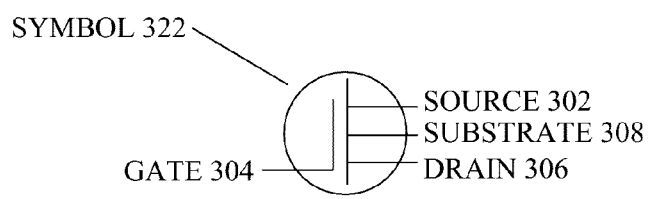

FIG. 3 illustrates a cross-sectional view of a metal-oxide-semiconductor field-effect transistor (MOSFET) device 300 in an aspect of the present disclosure. The MOSFET device 300 may have four input terminals. The four inputs are a source 302, a gate 304, a drain 306, and a substrate 308. The source 302 and the drain 306 may be fabricated as the wells 202 and 204 in the substrate 308, or may be fabricated as areas above the substrate 308, or as part of other layers on the die 106. Such other structures may be a fin or other structure that protrudes from a surface of the substrate 308. Further, the substrate 308 may be the substrate 200 on the die 106, but substrate 308 may also be one or more of the layers (e.g., 210-214) that are coupled to the substrate 200.

The MOSFET device 300 is a unipolar device, as electrical current is produced by only one type of charge carrier (e.g., either electrons or holes) depending on the type of MOSFET. The MOSFET device 300 operates by controlling the amount of charge carriers in the channel 310 between the source 302 and the drain 306. A voltage Vsource 312 is applied to the source 302, a voltage Vgate 314 is applied to the gate 304, and a voltage Vdrain 316 is applied to the drain 306. A separate voltage Vsubstrate 318 may also be applied to the substrate 308, although the voltage Vsubstrate 318 may be coupled to one of the voltage Vsource 312, the voltage Vgate 314 or the voltage Vdrain 316.

To control the charge carriers in the channel 310, the voltage Vgate 314 creates an electric field in the channel 310 when the gate 304 accumulates charges. The opposite charge to that accumulating on the gate 304 begins to accumulate in the channel 310. The gate insulator 320 insulates the charges accumulating on the gate 304 from the source 302, the drain 306, and the channel 310. The gate 304 and the channel 310, with the gate insulator 320 in between, create a capacitor, and as the voltage Vgate 314 increases, the charge carriers on the gate 304, acting as one plate of this capacitor, begin to accumulate. This accumulation of charges on the gate 304 attracts the opposite charge carriers into the channel 310. Eventually, enough charge carriers are accumulated in the channel 310 to provide an electrically conductive path between the source 302 and the drain 306. This condition may be referred to as opening the channel of the FET.

By changing the voltage Vsource 312 and the voltage Vdrain 316, and their relationship to the voltage Vgate 314, the amount of voltage applied to the gate 304 that opens the channel 310 may vary. For example, the voltage Vsource 312 is usually of a higher potential than that of the voltage Vdrain 316. Making the voltage differential between the voltage Vsource 312 and the voltage Vdrain 316 larger will change the amount of the voltage Vgate 314 used to open the channel 310. Further, a larger voltage differential will change the amount of electromotive force moving charge carriers through the channel 310, creating a larger current through the channel 310.

The gate insulator 320 material may be silicon oxide, or may be a dielectric or other material with a different dielectric constant (k) than silicon oxide. Further, the gate insulator 320 may be a combination of materials or different layers of materials. For example, the gate insulator 320 may be Aluminum Oxide, Hafnium Oxide, Hafnium Oxide Nitride, Zirconium Oxide, or laminates and/or alloys of these materials. Other materials for the gate insulator 320 may be used without departing from the scope of the present disclosure.

By changing the material for the gate insulator 320, and the thickness of the gate insulator 320 (e.g., the distance between the gate 304 and the channel 310), the amount of charge on the gate 304 to open the channel 310 may vary. A symbol 322 showing the terminals of the MOSFET device 300 is also illustrated. For N-channel MOSFETs (using electrons as charge carriers in the channel 310), an arrow is applied to the substrate 308 terminal in the symbol 322 pointing away from the gate 304 terminal. For p-type MOSFETs (using holes as charge carriers in the channel 310), an arrow is applied to the substrate 308 terminal in the symbol 322 pointing toward the gate 304 terminal.

The gate 304 may also be made of different materials. In some designs, the gate 304 is made from polycrystalline silicon, also referred to as polysilicon or poly, which is a conductive form of silicon. Although referred to as "poly" or "polysilicon" herein, metals, alloys, or other electrically conductive materials are contemplated as appropriate materials for the gate 304 as described in the present disclosure.

In some MOSFET designs, a high-k value material may be desired in the gate insulator 320, and in such designs, other conductive materials may be employed. For example, and not by way of limitation, a "high-k metal gate" design may employ a metal, such as copper, for the gate 304 terminal. Although referred to as "metal," polycrystalline materials, alloys, or other electrically conductive materials are contemplated as appropriate materials for the gate 304 as described in the present disclosure.

To interconnect to the MOSFET device 300, or to interconnect to other devices in the die 106 (e.g., semiconductor), interconnect traces or layers are used. These interconnect traces may be in one or more of layers (e.g., 210-214), or may be in other layers of the die 106.

Figure 4:
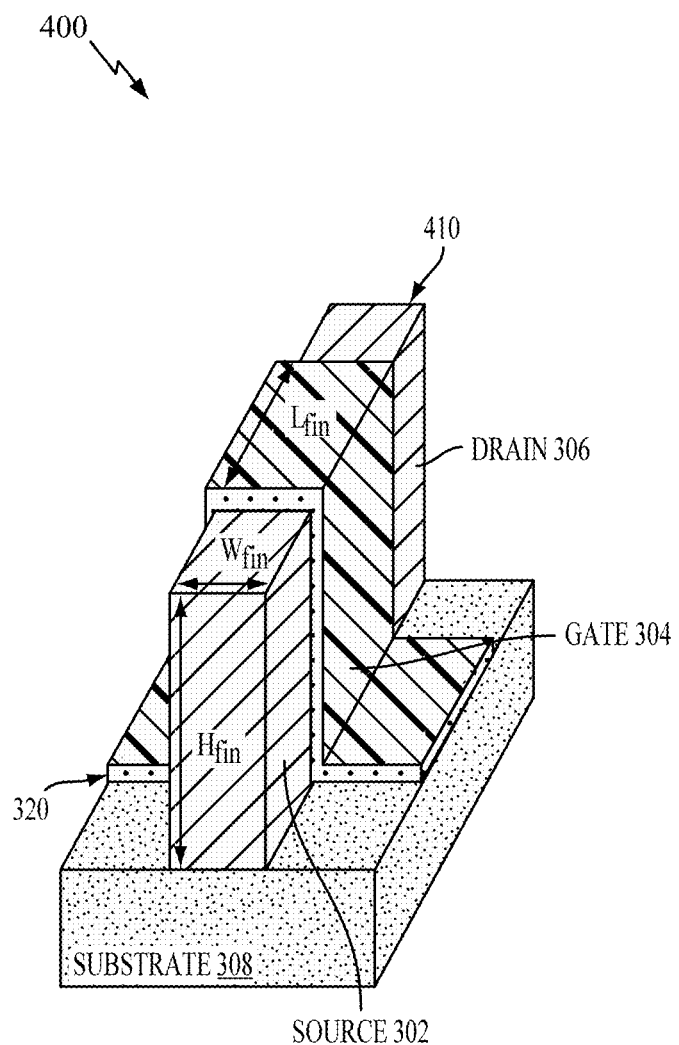
FIG. 4 illustrates a fin field effect transistor (FinFET) in accordance with an aspect of the present disclosure.

FIG. 4 illustrates a transistor in accordance with an aspect of the present disclosure. A fin-structured FET (FinFET 400) operates in a similar fashion to the MOSFET device 300 described with respect to FIG. 3. A fin 410 in a FinFET 400, however, is grown or otherwise coupled to the substrate 308. The substrate 308 may be a semiconductor substrate or other like supporting layer, for example, comprised of an oxide layer, a nitride layer, a metal oxide layer or a silicon layer. The fin 410 includes the source 302 and the drain 306. A gate 304 is disposed on the fin 410 and on the substrate 308 through a gate insulator 320. A height, Hfin, a width, Wfin, and a length, Lfin, represent the dimensions of the fin. In a FinFET structure, the physical size of the FinFET 400 may be smaller than the MOSFET device 300 structure shown in FIG. 3. This reduction in physical size allows for more devices per unit area on the die 106.

Sub-Fin Device Isolation

As device geometries are reduced, and additional device structures are added to an integrated circuit, isolation of devices, particularly adjacent devices, becomes more difficult. In planar devices, implantation processes may be used to electrically isolate one device from another. In fin-based devices, however, the geometry of the fins, and the fin pitch, render standard implantation processes ineffective. In particular, doping a portion of a FinFET that is closer to the substrate for isolation between devices is difficult because the active portion of the fin either impedes implantation, or also receives implantation, thereby reducing the effectiveness of the attempted isolation.

Doping a portion of the fin closer to the substrate (e.g., the "base" portion") isolates the source and drain of the FinFET from the substrate and from other devices, allowing more precise operation and anti-punchthrough protection of each device. An aspect of the present disclosure describes doping a base portion of the fin, (e.g., that portion of the fin that is closer to the substrate) with a doped oxide. The doped oxide is patterned to control the portion of the fin receiving the doping. The doped oxide is annealed which drives dopant atoms into that portion of the fin. This aspect of the present disclosure incorporates an anti-punchthrough doping in a precise manner to the base portion of the fin-based structures, which helps suppress sub-fin leakage into the substrate and/or other devices.

Figure 5:
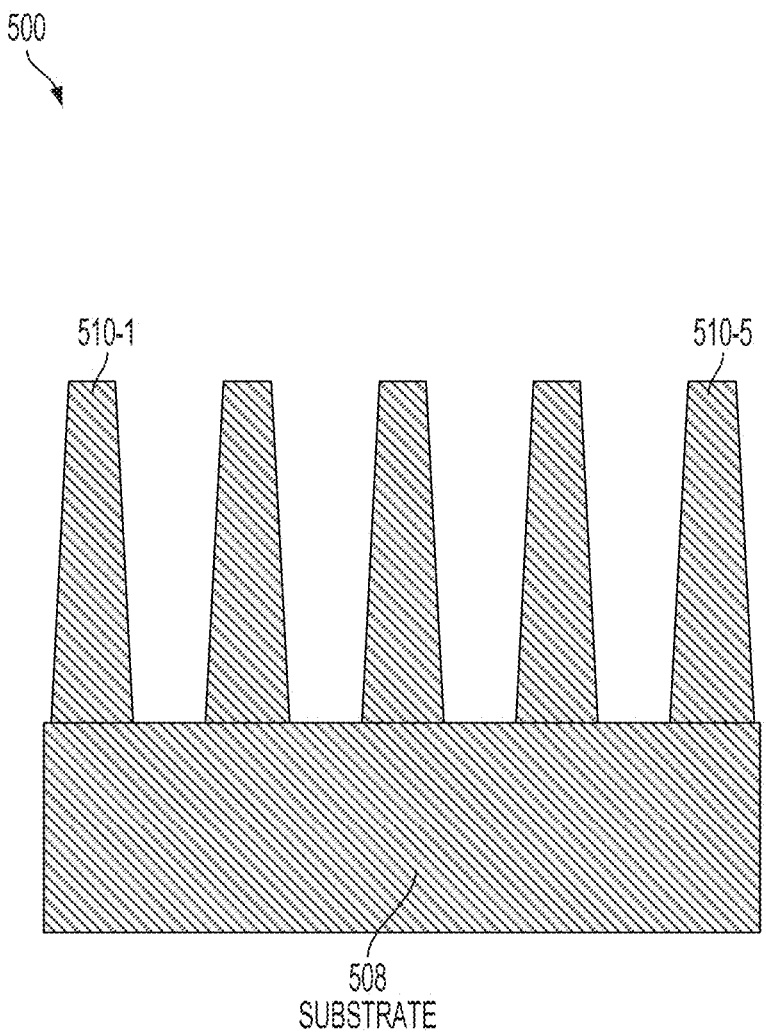
FIG. 5 illustrates a cross-sectional view of a fin-based structure in an aspect of the present disclosure.

FIG. 5 illustrates a cross-sectional view of a fin-based structure 500 in an aspect of the present disclosure. Within an integrated circuit, fin-based structures may be used. The fins 510 (510-1, ..., 510-5) are supported by a substrate 508 and doped with a specific type of charge carrier, such that the fins 510 are conductive. The fins 510 may be doped with an n-type dopant or a p-type dopant depending on the type of charge carrier desired in the final device.

Figure 6:
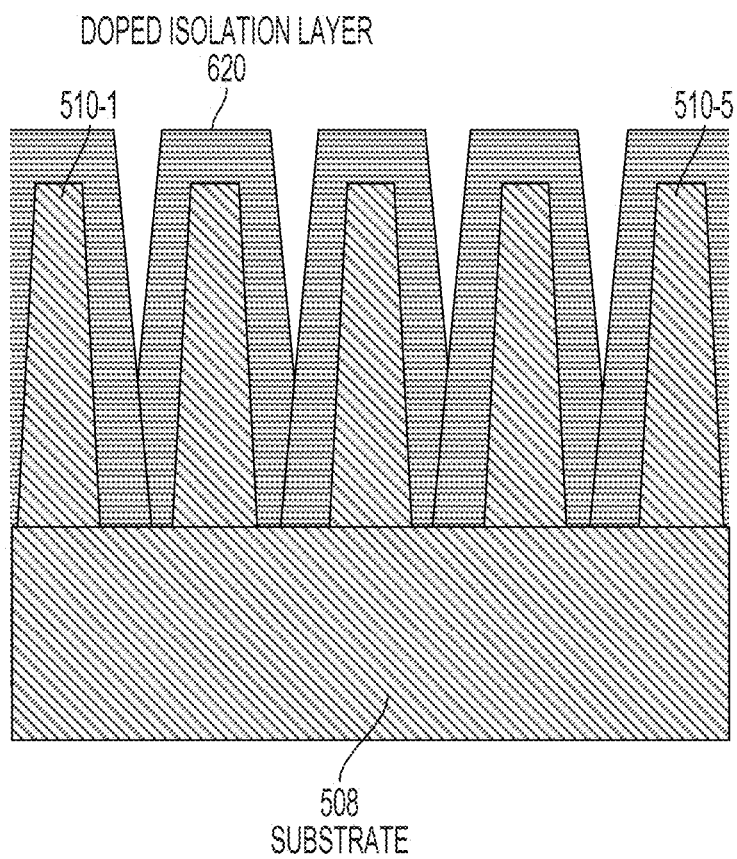
FIG. 6 illustrates a cross-sectional view of a doped oxide deposition in accordance with an aspect of the present disclosure.

FIG. 6 illustrates a cross-sectional view illustrating a doped isolation layer 620 in accordance with an aspect of the present disclosure. In a silicon-based structure, silicon dioxide may be used as an oxide for the doped oxide layer. Dopants for the doped isolation layer 620, may be boron, phosphorous, or other Group II, III, V, or VI elements and may be based on the material used in the fin-based structure. The doped isolation layer 620 may be grown on the fins 510. During oxide growth/deposition, the dopant may be entered into the oxide growth chamber as a gas or plasma, and would then be incorporated into the doped isolation layer 620 coupled to the fins 510.

Figure 7A:
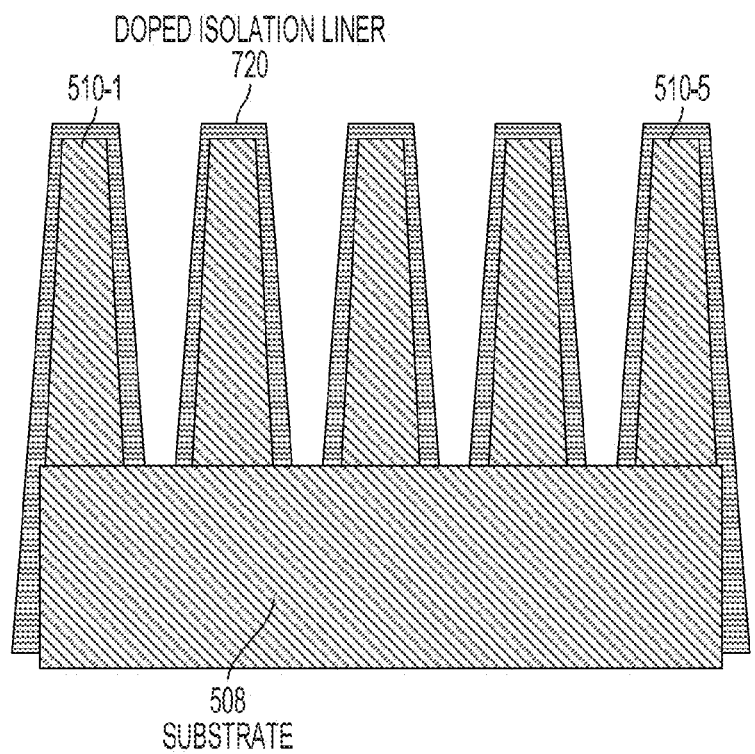
FIGS. 7A and 7B illustrate cross-sectional views of an etched doped oxide layer in an aspect of the present disclosure.

FIGS. 7A and B illustrate cross-sectional views of a doped isolation liner 720 in an aspect of the present disclosure. The doped isolation liner 720, because of the dopant introduction, is not as good of an insulator as a "pure" oxide. Further, the doped isolation liner 720 may grow in a manner that is too thick to allow for high-quality isolation material to be deposited in between the fins 510. Further, the doped isolation liner 720 may not grow in a uniform manner. An aspect of the present disclosure envisions that the doped isolation layer 620 may be deposited and etched as shown in FIG. 7A, or deposited/grown in an exact manner, which would result in the doped isolation liner 720 shown in FIG. 7A without etching.

Figure 7B:
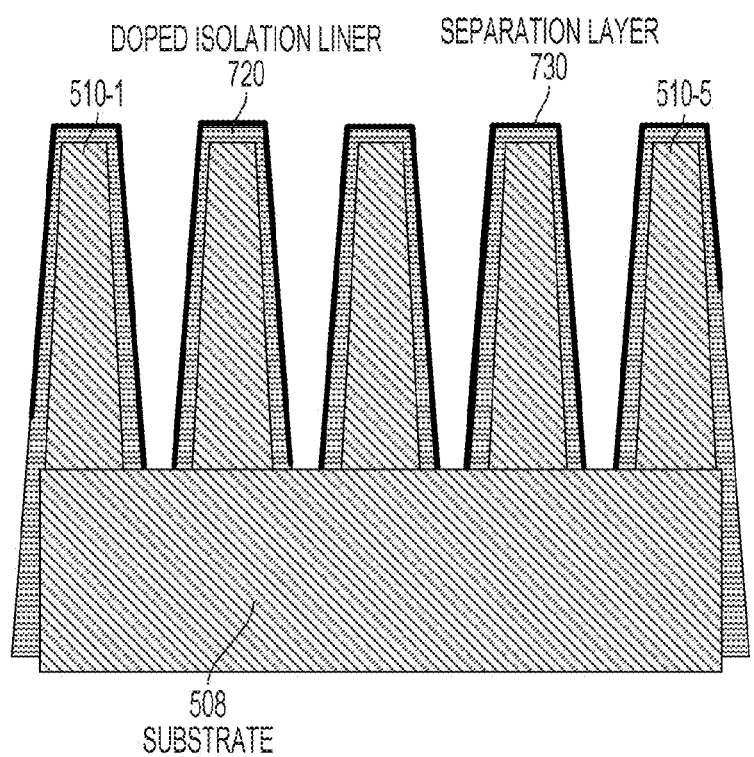

In addition, to direct the dopant into the fins 510, and/or to protect other isolation materials from degradation, a separation layer 730, which may be a nitride layer, may be grown or deposited on the doped isolation liner 720. This is shown in FIG. 7B. The fins 510 may also be doped with an n-type dopant or a p-type dopant depending on the type of charge carrier specified for the final device. In one aspect of the present disclosure, the separation layer 730 provides a dopant blocking layer for opposite polarity doping when integrating n-type and p-type metal oxide semiconductor (NMOS/PMOS) fin-based devices. For example, an n-type dopant is initially deposited on the fins 510 followed by deposition of the separation layer 730. Next, the separation layer 730 and the n-type dopant are removed from a PMOS portion of the fins 510, but remain on an NMOS portion of the fins 510. An p-type dopant is then deposited on the fin 510 followed by deposition of the separation layer 730 on only the PMOS portion of the fins 510. The p-type dopant are removed from the NMOS portion of the fins 510, but remains on the NMOS portion of the fins 510 due to the separation layer. The separation layer 730, however, is not shown for ease of illustration in FIGS. 8-12.

Figure 8:
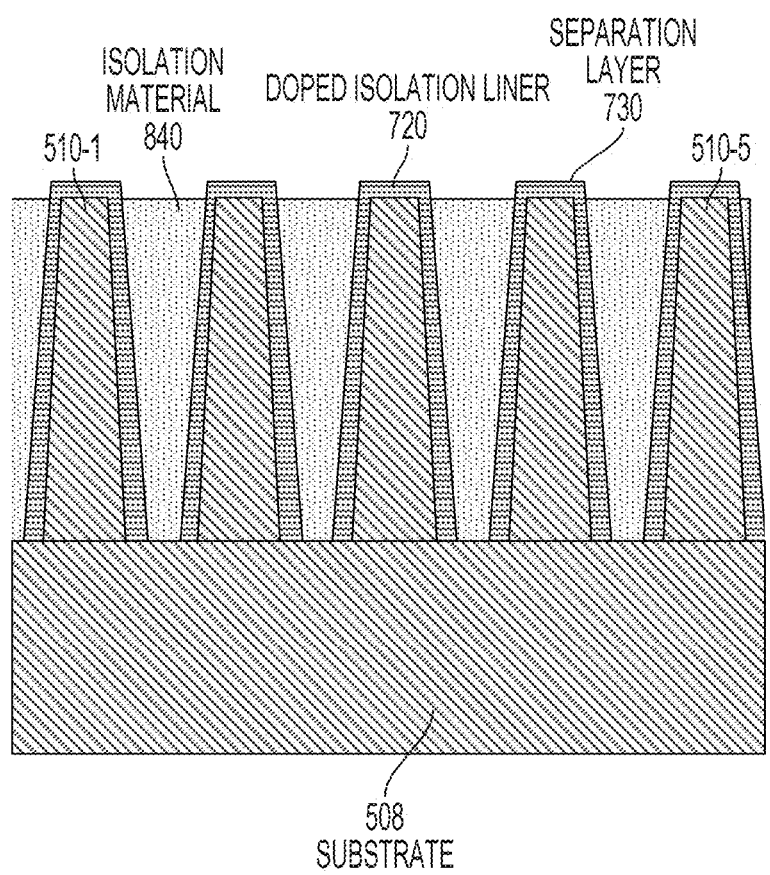
FIG. 8 illustrates a cross-sectional view of an isolation material deposition in accordance with an aspect of the present disclosure.

FIG. 8 illustrates a cross-sectional view of an isolation material 840 in accordance with an aspect of the present disclosure. Once the doped isolation layer 620 is thinned (or directly applied) to the proper thickness, the doped isolation liner 720 is formed. The doped isolation liner 720 has spaces in between the fins 510 at the intersection between the fins 510 and the substrate 508. An isolation material 840, such as a shallow-trench isolation (STI) material, is deposited in these spaces. The separation layer 730, if present, would be between the doped isolation liner 720 and the isolation material 840. The fins 510 are then planarized (see FIG. 9A), which may be performed using chemical-mechanical planarization (CMP), to expose the portion of the fin furthest from the substrate (e.g., the active portion of the fins, as shown in FIG. 9B).

Figure 9A:
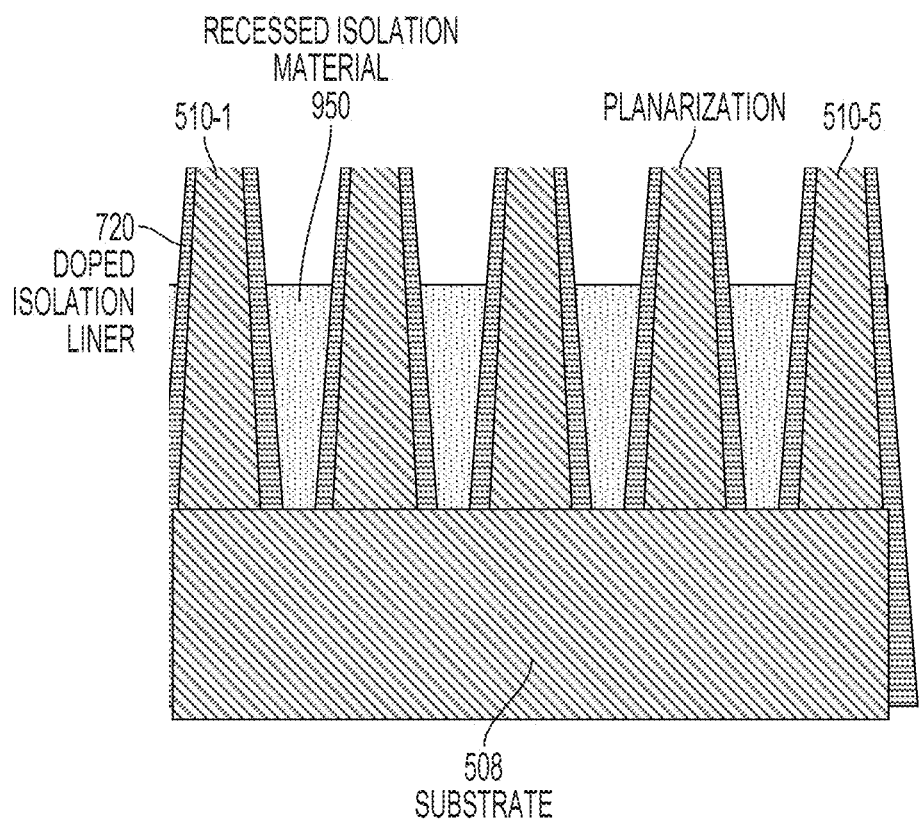
FIG. 9A illustrates a cross-sectional view of a recessed isolation material in an aspect of the present disclosure.

FIG. 9A illustrates a cross-sectional view of a recessed isolation material 950 in an aspect of the present disclosure. In this arrangement, the isolation material 840 is etched or otherwise recessed to a certain level toward the substrate 508, leaving the fins 510 exposed with the doped isolation liner 720 (and the separation layer 730, if deposited). This step of removing or etching the isolation material 840 is a first step in a two-step etching process. Because the volume of isolation material 840 removed in this step is larger than that removed at the base of the fin pitch, it is difficult to precisely control this first step of etching. The separation layer 730 protects the doped isolation liner 720, when the separation layer 730 is deposited, from this "rough" or "coarse" etching process.

Figure 9B:
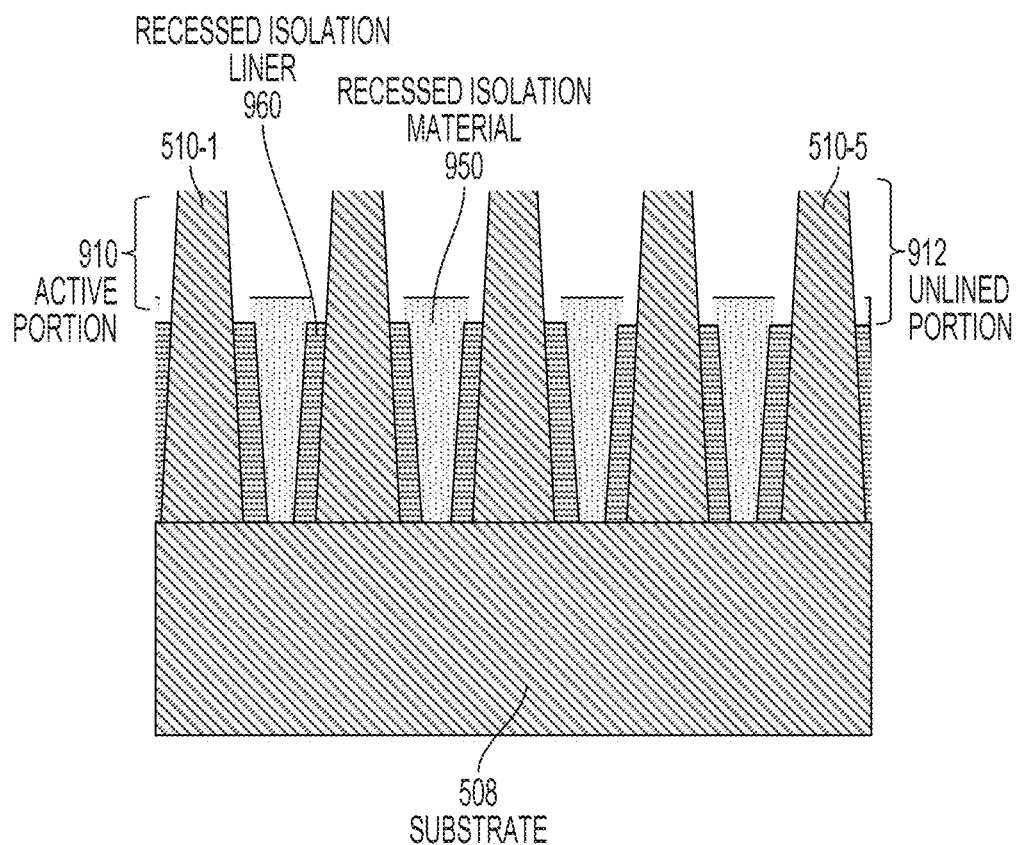
FIG. 9B illustrates a cross-sectional view of a recessed isolation material and a recessed doped oxide material in an aspect of the present disclosure.

FIG. 9B illustrates a cross-sectional view of the recessed isolation material 950 and a recessed isolation liner 960 in an aspect of the present disclosure. If the separation layer 730 was deposited, the separation layer 730 is removed first, exposing the doped isolation liner 720. Because the doped isolation liner 720 is thin compared to the isolation material 840, and has different chemical makeup from the dopant, the doped isolation liner 720 can be etched faster than the isolation material 840. Further, the removal of the doped isolation liner 720 may be precisely controlled to expose an unlined portion 912 of the active fin portion 910 of the fin-based structure 500.

The amount of the fins 510 to be exposed during the doped liner removal may take into account dopant up-diffusion, where the dopant in the doped isolation liner 720 diffuses upwards as well as through the width of the fins 510. As such, the etching of the doped isolation liner 720 below the level of the isolation material 840 forms an unlined portion 912 of the fins 510. Further, more of the fins 510 are exposed than the final intended active fin depth to account for up-diffusion dopant introduction by providing the recessed isolation liner 960. The separation layer (not shown) resists diffusion, and also protects the recessed isolation material 950 from diffusion of the dopant from the recessed isolation liner 960, as shown in FIG. 10.

Figure 10:
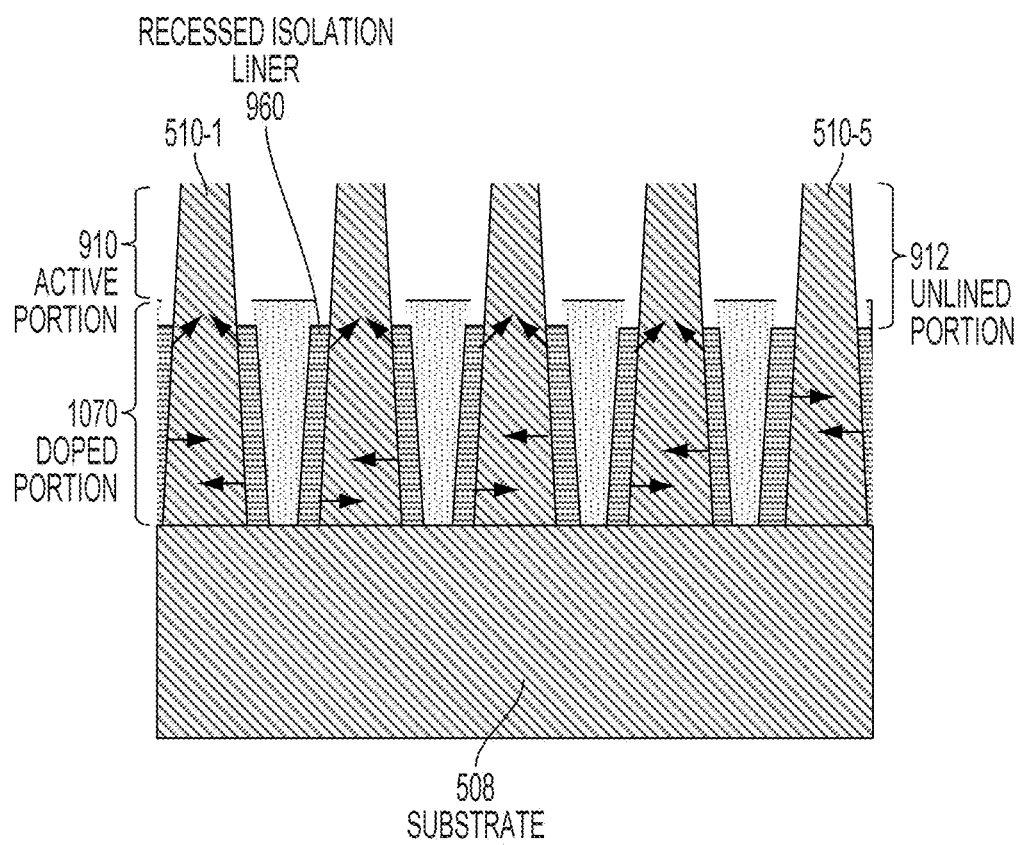
FIG. 10 illustrates an annealing process in accordance with an aspect of the present disclosure.

FIG. 10 illustrates an annealing process in accordance with an aspect of the present disclosure. Once the proper amount of doped isolation liner 720 is removed to provide the recessed isolation liner 960, the structure is annealed to drive the dopant into the fins 510 to form a doped portion 1070. The dopant in the doped isolation liner 720 is of a different charge carrier type than the charge carrier in the fins 510, which will reduce the conduction of the fins 510 in the base portion of the fin-based structure 500. In this arrangement, the recessed isolation liner 960 is disposed on the sidewalls of the doped portion 1070 of the fins 510. In addition, an unlined portion 912 of the fins 510 is also shown. In this arrangement, dopant up-diffusion causes formation of an unlined doped portion, as shown in FIG. 11.

Figure 11:
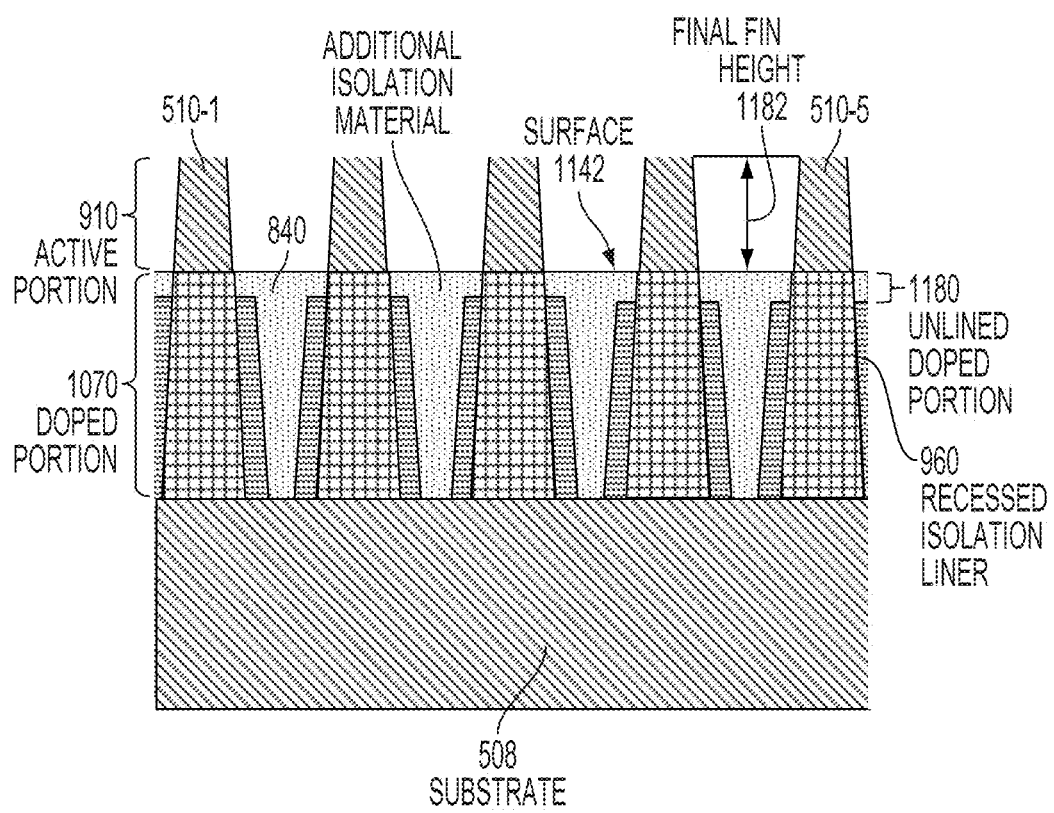
FIG. 11 illustrates depositing a layer of isolation material in accordance with an aspect of the present disclosure.

FIG. 11 illustrates depositing an additional layer of the isolation material 840 in accordance with an aspect of the present disclosure. The anneal drives the dopant atoms into the fins 510, which may result in a dopant density (of the opposite charge carrier type to that of the fin) in the range of $1 \times 10^{20}$ to $5 \times 10^{20}$. the active fin 910 is then electrically isolated from the substrate 508, as there is now a P-N junction between the active fin 910 and the doped portion 1070 of the fins 510. In addition, a P-N junction is provided between the doped portion 1070 of the fins 510 and an active surface of the substrate 508. To achieve a final fin height 1182, an additional isolation material is deposited on the fin-based structure 500. This may occur using standard deposition techniques, but also may be performed using a furnace chemical vapor deposition (FCVD) which would fill the volume in between fins from the portion nearest the substrate to the active portion of the fins. The deposition of the isolation material 840 may be controlled to adjust the exposed height of the fins 510 to achieve the final fin height 1182. In this arrangement, an unlined doped portion 1180 of the fins 510 extends from the recessed isolation liner 960 to a surface 1142 of the isolation material 840. In addition, the isolation material 840 is also disposed on the unlined doped portion 1180 of the fins 510.

Figure 12:
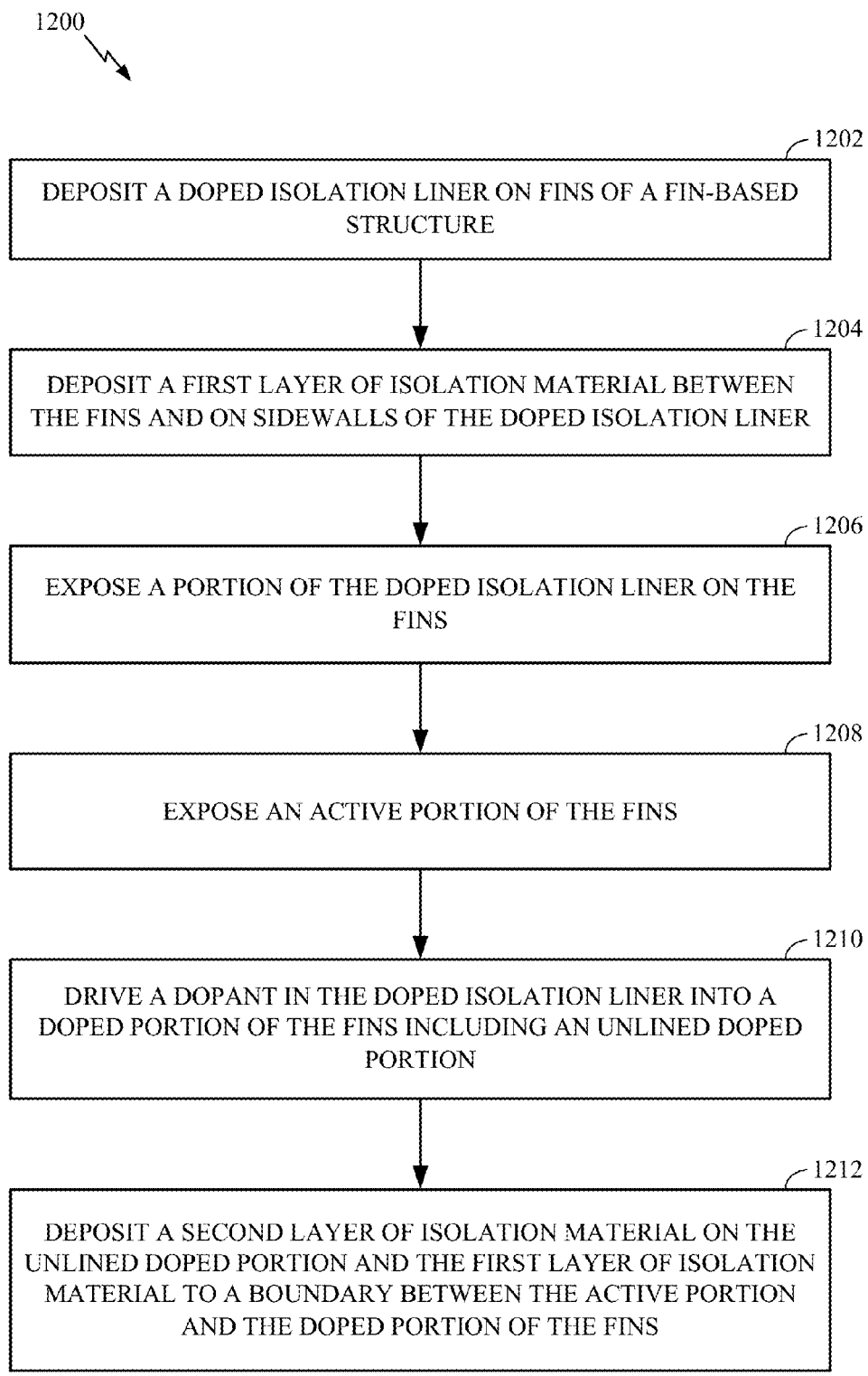
FIG. 12 illustrates a method for fabricating a fin-based structure in accordance with an aspect of the present disclosure.

FIG. 12 illustrates a method 1200 for fabricating a fin-based structure according to an aspect of the present disclosure. In block 1202, a doped isolation liner is provided on fins (e.g., fins 510) of a fin-based structure (e.g., fin-based structure 500). In block 1204, a first layer of isolation material (e.g., the isolation material 840) is deposited between the fins and on sidewalls of the doped isolation liner (e.g., the doped isolation liner 720). In block 1206, the first layer of isolation material is recessed to expose a portion of the doped isolation liner on the fins.

In block 1208, the doped isolation liner on the fins is etched to expose an active portion of the fins. In block 1210, the doped isolation liner is annealed to incorporate a dopant in the doped isolation liner into a doped portion (e.g., doped portion 1070) of the fins including an unlined doped portion (e.g., unlined doped portion 1180). In block 1212, a second layer of isolation material is deposited on the unlined doped portion and the first layer of isolation material to a boundary between the active portion and the doped portion of the fins. For example, an unlined doped portion 1180 of the fins 510 extends from the recessed isolation liner 960 to a surface 1142 of the isolation material 840. In addition, the isolation material 840 is disposed on the unlined doped portion 1180 of the fins 510.

According to an aspect of the present disclosure, a fin-based structure is described. In one configuration, the fin-based structure includes means for isolating between fins of the fin-based structure. The isolating means may be the isolation material 840. In another aspect, the aforementioned means may be any module or any apparatus or material configured to perform the functions recited by the aforementioned means.

Figure 13:
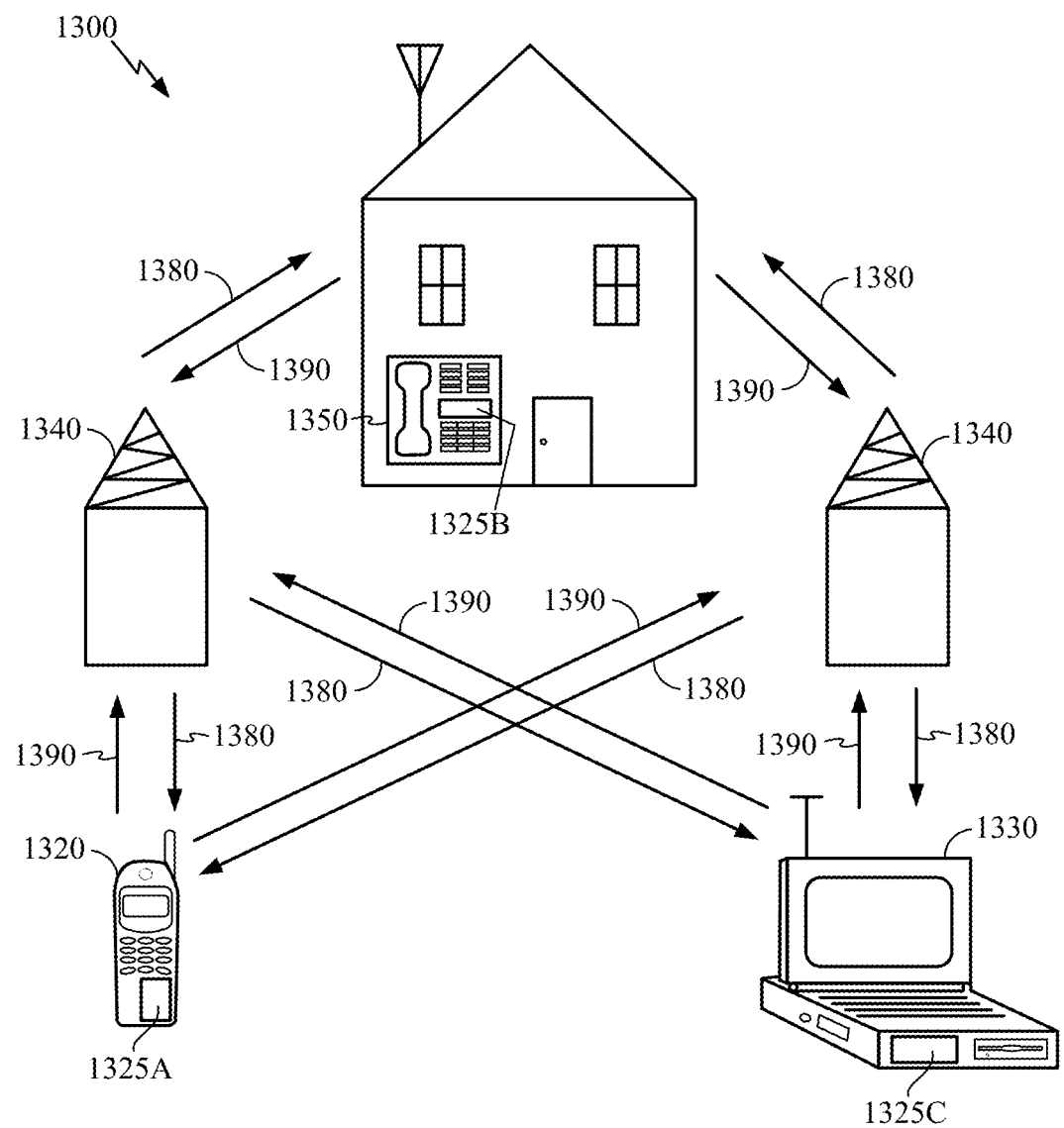
FIG. 13 is a block diagram showing an exemplary wireless communication system in which an aspect of the disclosure may be advantageously employed.

FIG. 13 is a block diagram showing an exemplary wireless communication system 1300 in which an aspect of the disclosure may be advantageously employed. For purposes of illustration, FIG. 13 shows three remote units 1320, 1330, and 1350 and two base stations 1340. It will be recognized that wireless communication systems may have many more remote units and base stations. Remote units 1320, 1330, and 1350 include IC devices 1325A, 1325C, and 1325B that include the disclosed FinFET devices. It will be recognized that other devices may also include the disclosed FinFET devices, such as the base stations, switching devices, and network equipment. FIG. 13 shows forward link signals 1380 from the base station 1340 to the remote units 1320, 1330, and 1350 and reverse link signals 1390 from the remote units 1320, 1330, and 1350 to base stations 1340.

In FIG. 13, remote unit 1320 is shown as a mobile telephone, remote unit 1330 is shown as a portable computer, and remote unit 1350 is shown as a fixed location remote unit in a wireless local loop system. For example, the remote units may be a mobile phone, a hand-held personal communication systems (PCS) unit, a portable data unit such as a personal data assistant, a GPS enabled device, a navigation device, a set top box, a music player, a video players, an entertainment unit, a fixed location data unit such as a meter reading equipment, or other devices that store or retrieve data or computer instructions, or combinations thereof. Although FIG. 13 illustrates remote units according to the aspects of the disclosure, the disclosure is not limited to these exemplary illustrated units. Aspects of the disclosure may be suitably employed in many devices, which include the disclosed FinFET devices.

Figure 14:
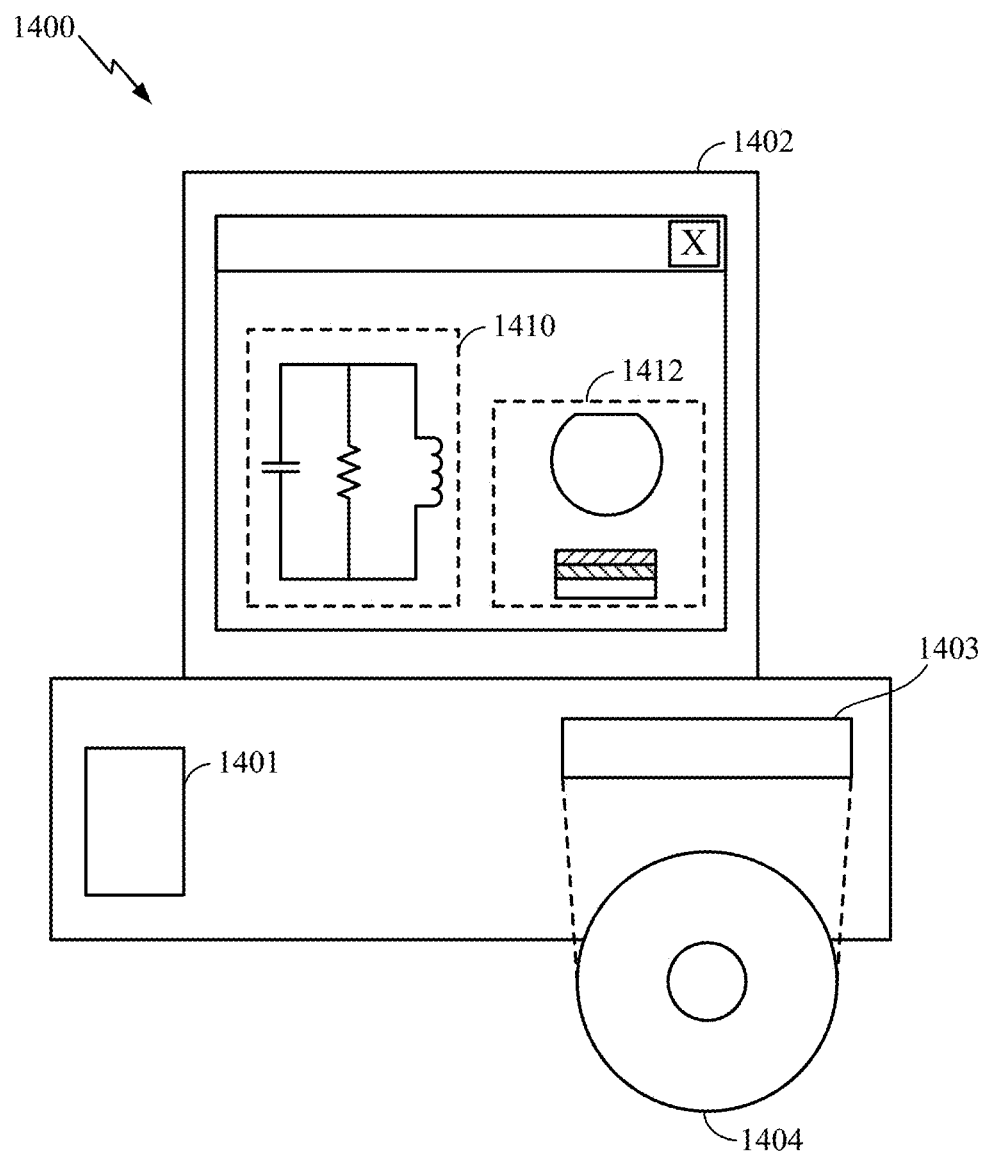
FIG. 14 is a block diagram illustrating a design workstation used for circuit, layout, and logic design of a fin-based structure according to one configuration

FIG. 14 is a block diagram illustrating a design workstation used for circuit, layout, and logic design of a fin-based structure, such as the FinFET devices disclosed above. A design workstation 1400 includes a hard disk 1401 containing operating system software, support files, and design software such as Cadence or OrCAD. The design workstation 1400 also includes a display 1402 to facilitate design of a circuit 1410 or a fin-based structure 1412 such as a FinFET device. A storage medium 1404 is provided for tangibly storing the design of the circuit 1410 or the fin-based structure 1412. The design of the circuit 1410 or the fin-based structure 1412 may be stored on the storage medium 1404 in a file format such as GDSII or GERBER. The storage medium 1404 may be a CD-ROM, DVD, hard disk, flash memory, or other appropriate device. Furthermore, the design workstation 1400 includes a drive apparatus 1403 for accepting input from or writing output to the storage medium 1404.

Data recorded on the storage medium 1404 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1404 facilitates the design of the circuit 1410 or the fin-based structure 1412 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A fin-based structure, comprising:
a plurality of fins on a surface of a semiconductor substrate, each including a doped portion proximate to the surface of the semiconductor substrate;
an isolation layer disposed between the plurality of fins and on the surface of the semiconductor substrate; and
a recessed isolation liner on sidewalls of the doped portion of the plurality of fins, an unlined doped portion of the plurality of fins extending from the recessed isolation liner to a surface of the isolation layer, the isolation layer exposing an active portion of the plurality of fins and disposed on the unlined doped portion of the plurality of fins, in which a P-N junction is provided between the active portion and the doped portion of the plurality of fins.

2. The fin-based structure of claim 1, further comprising a separation layer disposed between the isolation layer and the recessed isolation liner.

3. The fin-based structure of claim 2, in which the separation layer is a nitride based dopant blocking layer.

4. The fin-based structure of claim 1, in which the recessed isolation liner further comprises a doped isolation liner on the sidewalls of the doped portion of the plurality of fins extending from the surface of the semiconductor substrate to the unlined doped portion of the plurality of fins.

5. The fin-based structure of claim 1, in which the isolation layer comprises a first layer disposed between the plurality of fins and a second layer at a base of the active portion of the plurality of fins and disposed on the unlined doped portion of the plurality of fins.

6. The fin-based structure of claim 1 integrated into a mobile phone, a set top box, a music player, a video player, an entertainment unit, a navigation device, a computer, a hand-held personal communication systems (PCS) unit, a portable data unit, and/or a fixed location data unit.

7. A fin-based structure, comprising:
a plurality of fins on a surface of a semiconductor substrate, each including a doped portion proximate to the surface of the semiconductor substrate;
a means for isolating disposed between the plurality of fins and on the surface of the semiconductor substrate; and
a recessed isolation liner on sidewalls of the doped portion of the plurality of fins, an unlined doped portion of the plurality of fins extending from the recessed isolation liner to a surface of the isolating means, the isolating means exposing an active portion of the plurality of fins and disposed on the unlined doped portion of the plurality of fins, in which a P-N junction is provided between the active portion and the doped portion of the plurality of fins.

8. The fin-based structure of claim 7, further comprising a separation layer disposed between the isolating means and the recessed isolation liner.

9. The fin-based structure of claim 8, in which the separation layer is a nitride based dopant blocking layer.

10. The fin-based structure of claim 7, in which the recessed isolation liner further comprises a doped isolation liner on the sidewalls of the doped portion of the plurality of fins extending from the surface of the semiconductor substrate to the unlined doped portion of the plurality of fins.

11. The fin-based structure of claim 7, in which the isolating means comprises a first layer disposed between the plurality of fins and a second layer at a base of the active portion of the plurality of fins and disposed on the unlined doped portion of the plurality of fins.

12. The fin-based structure of claim 7 integrated into a mobile phone, a set top box, a music player, a video player, an entertainment unit, a navigation device, a computer, a hand-held personal communication systems (PCS) unit, a portable data unit, and/or a fixed location data unit.

* * * * *